(12) United States Patent
Sekine et al.

(10) Patent No.: US 8,217,403 B1
(45) Date of Patent: Jul. 10, 2012

(54) ELECTRONIC DEVICE

(75) Inventors: Shigenobu Sekine, Tokyo (JP); Yurina Sekine, Tokyo (JP)

(73) Assignee: Napra Co., Ltd., Tokyo (JP)

( * ) Notice: Subject to any disclaimer, the term of this patent is extended or adjusted under 35 U.S.C. 154(b) by 0 days.

(21) Appl. No.: 13/179,073

(22) Filed: Jul. 8, 2011

(30) Foreign Application Priority Data

Mar. 8, 2011 (JP) .................. 2011-050361

(51) Int. Cl.
 *H01L 27/15* (2006.01)
(52) U.S. Cl. .................. 257/79; 257/88; 257/E25.007; 257/E27.124; 257/E23.023
(58) Field of Classification Search .......... 257/88, 257/79, E31.001, E25.007, E27.124, 82, 257/95, 99, E33.068, E23.023
See application file for complete search history.

(56) References Cited

U.S. PATENT DOCUMENTS

| | | |
|---|---|---|
| 2002/0149117 A1 | 10/2002 | Shibata |
| 2005/0167679 A1* | 8/2005 | Ishii et al. .......... 257/79 |
| 2005/0211993 A1* | 9/2005 | Sano et al. .......... 257/79 |
| 2010/0003781 A1* | 1/2010 | Van Duren et al. ........ 438/98 |

FOREIGN PATENT DOCUMENTS

| | | |
|---|---|---|
| JP | 01-270580 A | 10/1989 |
| JP | 05-212579 A | 8/1993 |
| JP | 07-138549 A | 5/1995 |
| JP | 10-134636 A | 5/1998 |
| JP | 2001-189107 A | 7/2001 |
| JP | 2002-289768 A | 10/2002 |
| JP | 2003-104772 A | 4/2003 |
| JP | 2010-514217 A | 4/2010 |
| JP | 2010-246001 A | 10/2010 |
| WO | 2008/076428 A1 | 6/2008 |

* cited by examiner

*Primary Examiner* — Benjamin Sandvik
*Assistant Examiner* — Whitney T Moore
(74) *Attorney, Agent, or Firm* — Westerman, Hattori, Daniels & Adrian, LLP

(57) ABSTRACT

An electronic device includes a substrate and an electronic component. The substrate has a metallized trace. The metallized trace has a metallized layer and an insulation layer. The metallized layer has a high melting point metal component and a low melting point metal component, the high melting point metal component and the low melting point metal component being diffusion bonded together. The insulation layer is formed simultaneously with the metallized layer to cover an outer surface of the metallized layer. The electronic component is electrically connected to the metallized layer.

29 Claims, 15 Drawing Sheets

ELECTRONIC DEVICE

BACKGROUND OF THE INVENTION

1. Field of the Invention

The present invention relates to electronic devices, i.e., electrical products based on the technology of electronics. Electronic devices relating to the present invention include not only a typical electronic device having electronic components arranged on a substrate but also other types of electronic devices including a solar cell, a photovoltaic unit and a light-emitting device, a lighting apparatus and a signal light using a light-emitting diode.

2. Description of the Related Art

In electronic devices, as is well known, traces having a predetermined pattern are formed on one side of a substrate and electronic components such as active components or passive components are soldered onto the trace pattern. The trace pattern can be obtained by applying an etching resist to a Cu foil previously formed on the substrate and then patterning the Cu foil by photolithography. A solder resist film of a thermosetting epoxy resin or the like is formed on the substrate such that the Cu foil is exposed only at portions of the trace pattern which are required for soldering of the electronic components while solder cannot adhere to the other portions which are not required for soldering. Then, the electronic components are soldered to the exposed Cu foil.

As described above, the production of conventional electronic devices requires many processes, e.g., preparation of a copper-foiled substrate, application of an etching resist, photolithography, application of a solder resist and mounting of components. Thus, there is a limit to cost reduction and improvement in productivity.

The above process may be replaced with a process of screen-printing a conductive paste directly on the substrate. In this case, the conductive past to be used should have metal or alloy powder dispersed in an organic vehicle as a conductive component. The organic vehicle comprises an insulating resin such as a thermosetting insulating resin or a thermoplastic insulating resin and a solvent. If necessary, a third component may be added so as to improve dispersibility of the metal powder or ensure fire retardancy.

The trace pattern thus obtained has the metal powder dispersed in the insulating resin. This deteriorates the conductivity as compared with the case of a sheer metal conductor.

In order to improve the conductivity, accordingly, the packing ratio can be increased by using metal powder having a small grain size. However, the smaller the grain size, the more easily the metal powder aggregates, which makes it difficult to achieve uniform dispersion in the conductive paste and also increases the contact area between adjacent metal particles to thereby increase the contact resistance, so that the conductivity cannot be sufficiently improved in accordance with an increase in packing ratio.

It is also known that traces having good conductivity can be obtained by using silver powder or Cu powder as the above metal powder.

However, when an electric field is applied to the conductive paste containing the silver powder in hot and humid atmosphere, electrodeposition of silver on an electrical circuit or an electrode, so-called migration, occurs to establish a short circuit between electrodes of the trace pattern or traces. As a countermeasure against the migration, for example, there has been known a method of applying a moistureproof coating onto the silver powder or a method of adding a corrosion inhibitor such as nitrogen oxide to the conductive paste, but they are not sufficiently effective (see Japanese Unexamined Patent Application Publication No. 2001-189107). In order to obtain a highly conductive conductor, moreover, it is necessary to increase the amount of the silver powder to be added, but the silver powder is so expensive that the electronic device also becomes expensive.

On the other hand, since Cu can easily be oxidized after heating and hardening the conductive paste containing the Cu powder, the Cu powder reacts with oxygen in the air or the binder to form an oxide film thereon, thereby remarkably reducing the conductivity. As its countermeasure, Japanese Unexamined Patent Application Publication No. 5-212579 discloses a Cu paste into which a variety of additives are added to prevent the oxidation of the Cu powder and stabilize the conductivity. However, it is inferior to the silver paste in conductivity and also has a defect in shelf life and stability.

A conductive paste using silver-plated Cu powder has also been suggested in order to realize an inexpensive conductive paste improved in the migration (see Japanese Unexamined Patent Application Publication Nos. 7-138549 & 10-134636). However, if the silver is applied uniformly and thick, the migration improving effect may not be obtained sufficiently. If it is applied thin, on the other hand, the filling amount of the conductive powder has to be increased for ensuring good conductivity, which may cause a problem of reducing the adhesive force (adhesive strength) due to relative decrease of the binder component.

Moreover, electronic devices for outdoor use, e.g., solar cells, need long-term durability against severe environmental changes. Particularly when solar cells are installed in desert having long sunshine duration or the like, the temperature range at the installation site may exceed 100° C. However, if conventional solar cells having their electrodes formed with the above technology are put in such a harsh natural environment, the electrodes may deteriorate in a few years to cause peeling or the like.

SUMMARY OF THE INVENTION

It is an object of the present invention to provide an electronic device with a high-quality, highly-reliable metallized trace which is excellent in conductivity, electrochemical stability, oxidation resistance, packability, density, and mechanical and physical strength and also has high adhesion strength and bond strength to a substrate.

In order to achieve the above object, an electronic device according to the present invention comprises a substrate and an electronic component. The substrate has a metallized trace and the electronic component is electrically connected to the metallized trace over the substrate. The metallized trace has a metallized layer and an insulation layer.

The metallized layer has a high melting point metal component and a low melting point metal component, the high melting point metal component and the low melting point metal component being diffusion bonded together. The insulation layer is formed simultaneously with the metallized layer to form a protective film covering an outer surface of the metallized layer.

In the present invention, as described above, since the metallized layer has a high melting point metal component and a low melting point metal component, diffusion bonding between the high melting point metal component and the low melting point metal component can occur at a lower melting point of the low melting point metal component.

As described above, since the high melting point metal component and the low melting point metal component are diffusion bonded together, the electronic device can be provided with a metallized layer which is excellent in electrochemical stability and oxidation resistance and hardly causes the migration or an oxide film.

In addition, since the diffusion bonding of the high melting point metal component and the low melting point metal component provides a continuous metallized layer substantially free from a pore or disconnection, the metallized layer can be increased in packing ratio and density, so that the electronic device can be provided with a metallized layer having high conductivity and high mechanical and physical strength. Moreover, since it contains both the high melting point metal component and the low melting point metal component, the electronic device can be provided with a highly conductive metallized layer depending on the material selection.

Furthermore, since the insulation layer forms a protective film covering an outer surface of the metallized layer, the metallized layer can be prevented from being externally damaged and can also be improved in oxidation resistance, durability and weather resistance. Still furthermore, since the insulation layer has adhesion strength and bond strength to the substrate in addition to adhesion strength and bond strength of the metallized layer itself, the whole metallized trace can be improved in adhesion strength and bond strength.

Still furthermore, since the insulation layer is formed simultaneously with the metallized layer, the metallized layer can be prevented from being exposed to the air, unlike the one whose metallized layer is formed at a different time from the insulation layer. Therefore, the electronic device can be provided with a high-quality, oxidation-free metallized layer.

As a total result of the above effects, the electronic device can be provided with a high-quality, highly-reliable metallized trace which is excellent in conductivity, electrochemical stability, oxidation resistance, packability, density, and mechanical and physical strength and also has high adhesion strength and bond strength to a substrate.

The metallized trace may be formed on a metal or alloy film such as a Cu film (Cu foil). If the metallized trace of the high melting point metal component and the low melting point metal component is formed on the Cu film, the electrical resistance can be reduced by increasing the sectional area of the whole metallized trace without varying the thickness of the Cu foil. Alternatively, the electrical resistance can be reduced by increasing the sectional area of the whole metallized trace while reducing the thickness of the Cu foil.

The electronic device according to the present invention may be any electrical product based on the technology of electronics. Particularly, the present invention discloses a computer, a mobile phone, a multilayer electronic equipment, an electronic device, an electronic component, a solar cell, a light-emitting diode, a light-emitting device, a lighting apparatus, a signal light and a liquid crystal display. Although they are referred to by specific names, they are electrical products based on the technology of electronics and therefore included in the category of the electronic device according to the present invention.

As has been described above, the present invention can provide an electronic device with a high-quality, highly-reliable metallized trace which is excellent in electrochemical stability, oxidation resistance, packability, density, conductivity and mechanical and physical strength and also has high adhesion strength and bond strength to a substrate.

The present invention will be more fully understood from the detailed description given hereinbelow and the accompanying drawings which are given by way of illustration only, and thus not to be considered as limiting the present invention.

DESCRIPTION OF THE PREFERRED EMBODIMENTS

Figure 1:
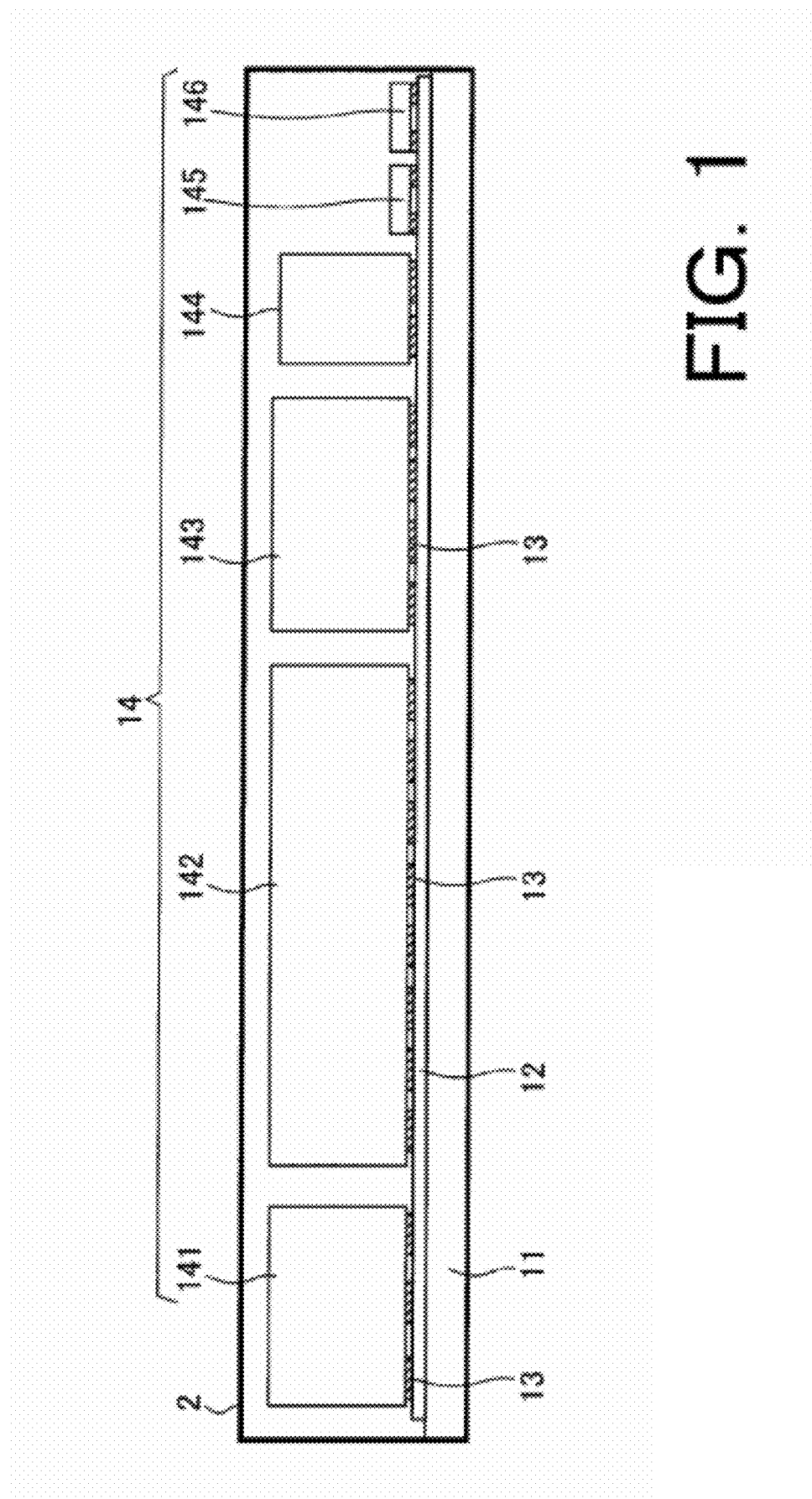
FIG. 1 is a drawing showing one embodiment of an electronic device according to the present invention.

Referring to FIG. 1, an electronic device according to the present invention comprises a substrate 11 and electronic components 141 to 146. In general, they are arranged inside an outer jacket 2.

The substrate 11 has a metallized trace 12 having a predetermined pattern. The substrate 11 may be an organic substrate or an inorganic substrate. It may also be a substrate capable of forming a semiconductor circuit, e.g., a Si substrate, or a simple insulating substrate.

The electronic components 141 to 146 are electrically connected to the metallized trace 12 over the substrate 11. In FIG. 1, the electronic components 141 to 146 are represented as a group by a symbol 14. The electronic components 141 to 146 are active components, passive components or composite components thereof, and their number, type, shape and so on can vary depending on the function and design of the electronic device. The electronic components 141 to 146 are designed to affect the behavior of electrons within the electronic system and associated force fields in a predetermined manner so that the system can fulfill an intended function. The electronic components 141 to 146 are connected to each other through the metallized trace 12, forming an electronic circuit having a specific function. The electronic components 141 to 146 may be packaged individually or packaged collectively into a module in the form of an integrated circuit.

The electronic device according to the present invention may also be embodied as an electronic device in which the substrate 11 serves the function of the electronic components 141 to 146 without clear distinction between the substrate 11 and the electronic components 141 to 146, for example, as a solar cell.

Figure 2:
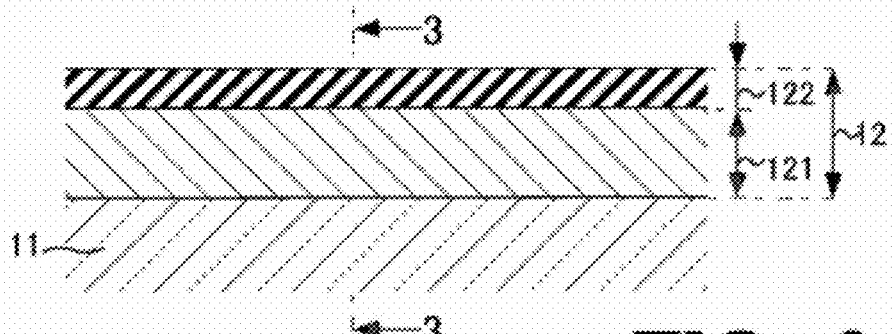
FIG. 2 is a sectional view showing a part of a metallized trace used in the electronic device shown in FIG. 1.
Figure 3:
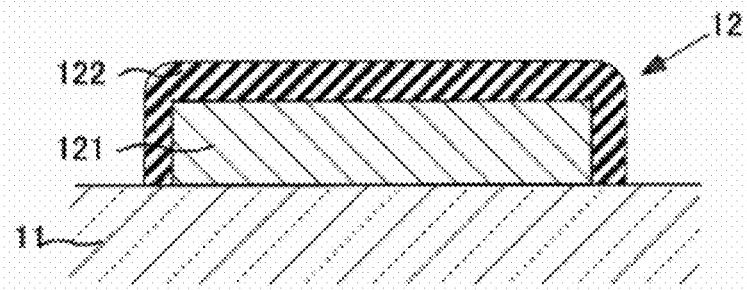
FIG. 3 is a sectional view taken along line 3-3 in FIG. 2.

As shown in FIGS. 2 and 3, the metallized trace 12 has a metallized layer 121 and an insulation layer 122. The metallized layer 121 has a high melting point metal component and a low melting point metal component, the high melting point metal component and the low melting point metal component being diffusion bonded together to form a continuous metal layer having a high packing density. The high melting point metal component may include at least one component selected from the group consisting of Ag, Cu, Au, Pt, Ti, Zn, Al, Fe, Si and Ni, while the low melting point metal component may include at least one component selected from the group consisting of Sn, In, Bi and Ga. The metallized layer 121 may contain a carbon nanotube.

The insulation layer 122 comprises an insulating resin and is formed simultaneously with the metallized layer 121 to form a protective film covering the outer surface of the metallized layer 121. As shown in FIGS. 2 and 3, the insulation layer 122 continuously covers the metallized layer 121 with a given thickness at its top face, side faces in a line width direction and end faces in a length direction.

Figure 4:
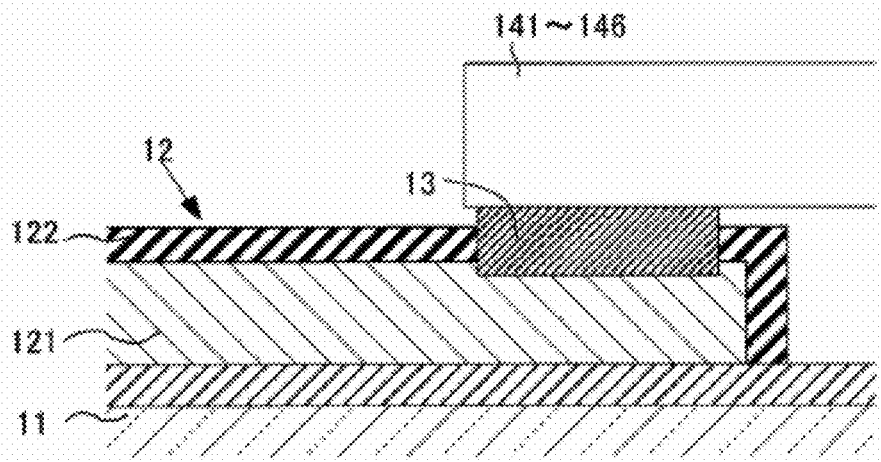
FIG. 4 is a sectional view taken at a different position of a metallized trace used in the electronic device shown in FIG. 1.

As shown in FIG. 4, moreover, the electronic components 141 to 146 are connected such that a terminal electrode 13 penetrates through the insulation layer 122 into the underlying metallized layer 121. The terminal electrode 13 is surrounded by the insulation layer 122.

As described above, since the metallized layer 121 has a high melting point metal component and a low melting point metal component, diffusion bonding between the high melting point metal component and the low melting point metal component can occur at a lower melting point of the low melting point metal component. With the high melting point metal component and the low melting point metal component being thus diffusion bonded together, the following effects can be obtained.

At first, since the high melting point metal component and the low melting point metal component are diffusion bonded together, the electronic device can be provided with a highly electrochemically-stable, highly oxidation-resistant metallized layer 121.

When Ag is used as the high melting point metal component, for example, the diffusion bonding occurs between Ag and the low melting point metal component in the metallized layer 121, increasing electrochemical stability to certainly prevent the migration of Ag. Also when Cu is used as the high melting point metal component, the diffusion bonding occurs between Cu and the low melting point metal component, preventing the oxidization of Cu.

In addition, since the diffusion bonding of the high melting point metal component and the low melting point metal component provides a continuous metallized layer 121 free from a pore or disconnection, the packing ratio and density of the metallized layer 121 can be improved to increase not only conductivity but also mechanical and physical strength. Moreover, since it contains both the high melting point metal component and the low melting point metal component, the electronic device can be provided with a highly conductive metallized layer 121 depending on the material selection.

Furthermore, since the insulation layer 122 forms a protective film covering the outer surface of the metallized layer 121, the metallized layer 121 can be prevented from being externally damaged and can also be improved in oxidation resistance, durability and weather resistance. Still furthermore, since the insulation layer 122 has adhesion strength and bond strength in addition to adhesion strength and bond strength of the metallized layer 121 itself, the whole metallized trace 12 can be improved in adhesion strength and bond strength.

Still furthermore, since the insulation layer 122 is formed simultaneously with the metallized layer 121, the metallized layer 121 can be prevented from being exposed to the air, unlike the one whose metallized layer 121 is formed at a different time from the insulation layer 122. Therefore, the electronic device can be provided with a high-quality, oxidation-free metallized layer 121.

As a total result of the above effects, the electronic device can be provided with a high-quality, highly-reliable metallized layer 121 which is excellent in conductivity, electrochemical stability, oxidation resistance, packability, density, and mechanical and physical strength and also has high adhesion strength and bond strength to a substrate.

The metallized layer 121 and the insulation layer 122 can be formed by using a conductive paste including an insulating resin, a metal component and a solvent. The insulating resin for forming the insulation layer 122 may comprise a thermosetting insulating resin or a thermoplastic insulating resin. In the case of using the thermosetting insulating resin, its curing point is preferably higher than the melting point of the low melting point metal component but lower than the melting point of the high melting point metal component.

Preferably, the insulating resin includes at least one component selected from an epoxy insulating resin, an acrylate insulating resin and a phenolic insulating resin. As a solvent for making it into a paste, there can be used a known organic solvent such as butyl carbitol, butyl carbitol acetate, butyl cellosolve, methyl isobutyl ketone, toluene or xylene.

Figure 5:
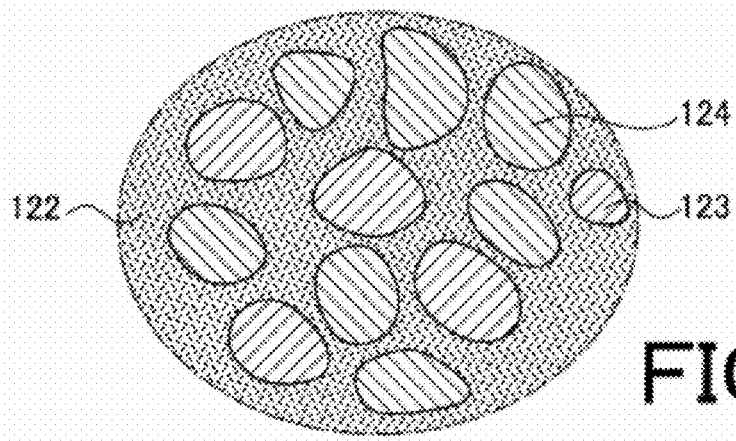
FIG. 5 is a drawing showing a conductive paste for forming a metallized trace.
Figure 6:
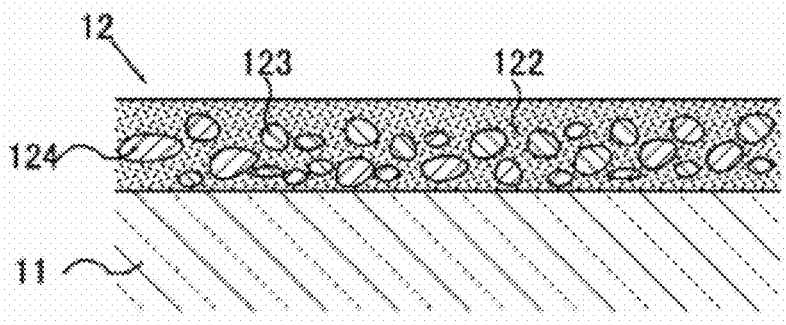
FIG. 6 is a drawing showing a coated state of the conductive paste shown in FIG. 5.

The metallized layer 121 and the insulation layer 122 can be obtained such that a conductive paste comprising an insulating resin 122 and a metal component including a high melting point metal component 124 being metal particles and a low melting point metal component 123 being metal particles, as shown in FIG. 5, is applied in a given pattern to the substrate 11, as shown in FIG. 6, using a screen printing technology and then subjected to a heat treatment. This eliminates the need for the preparation of a copper-foiled substrate, the process of applying an etching resist and the photolithography process which have been indispensable in the past, thereby achieving considerable cost reduction and improving productivity.

In the heat treatment, preferably, heating is performed at a temperature higher than the melting point of the low melting point metal component 123 and lower than the melting point of the high melting point metal component 124, e.g., 100 to 300° C. This heat treatment melts the low melting point metal component 123, allowing the high melting point metal component 124 and the low melting point metal component 123 to aggregate into a packed structure where the space between adjacent parts of the high melting point metal component 124 is filled with the molten low melting point metal component 123, while causing the diffusion bonding (intermetallic bonding) between the low melting point metal component 123 and the high melting point metal component 124. This diffusion bonding makes it possible to form a metallized layer 121 not containing the insulating resin. The metallized layer 121 sinks below the insulating resin layer 122 because of the difference in specific gravity. This results in providing a two-layer metallized trace 12 in which an outer surface (top face and side faces) of the metallized layer 121 adhered to the substrate 11 is covered with the protective layer 122 of an insulating resin. Since the insulation layer 122 serves as a protective film 122 covering the outer surface (top face and side faces) of the metallized layer 121, an additional process for applying the protective film 122 is not required.

Even when Ag is used as the high melting point metal component, the diffusion bonding also occurs between Ag and the low melting point metal component in the metallized layer 121, and the metallized layer 121 is further covered with the insulation layer 122 in the entire conductive composition. This structure certainly prevents the migration of Ag. Also when Cu is used as the high melting point metal component, the diffusion bonding occurs between Cu and the low melting point metal component, and the metallized layer 121 is further covered with the insulation layer 122, thereby preventing the oxidation of Cu.

Figure 7:
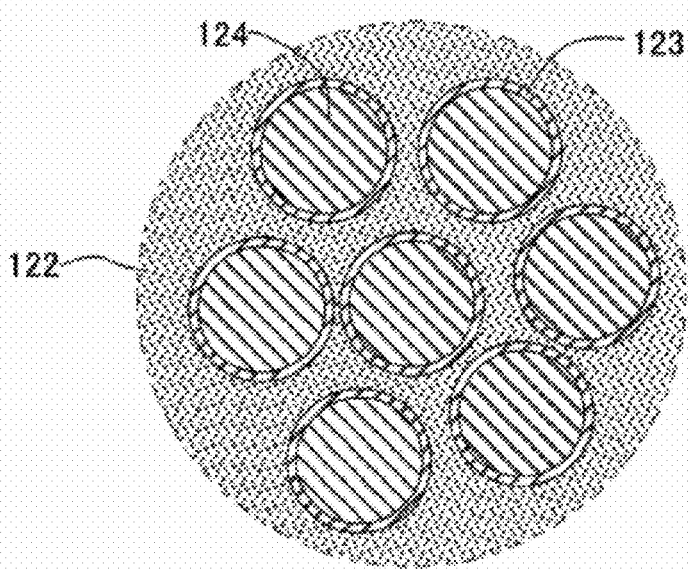
FIG. 7 is a drawing showing another conductive paste for forming a metallized trace.

According to another embodiment, the conductive paste may use metal particles prepared by covering high melting point metal particles 124 with a low melting point metal film 123, as shown in FIG. 7, or metal particles prepared by covering low melting point metal particles 124 with a high melting point metal film to the contrary.

Figure 8:
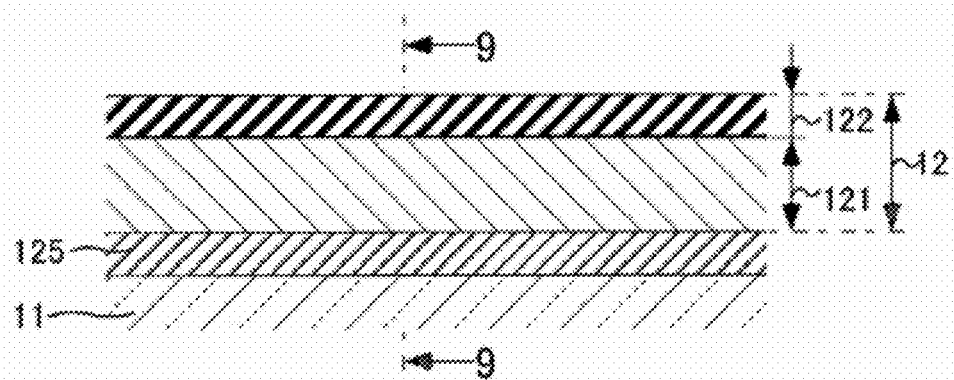
FIG. 8 is a sectional view showing another metallized trace used in an electronic device according to the present invention.
Figure 9:
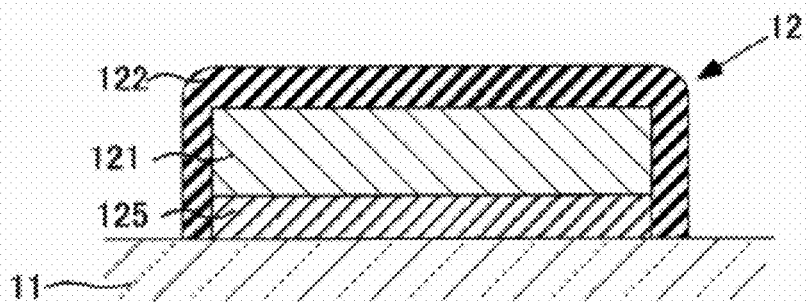
FIG. 9 is a sectional view taken along line 9-9 in FIG. 8.

The metallized trace 12 of the high melting point metal component and the low melting point metal component may be formed on a metal film 125 such as a Cu film, as shown in FIGS. 8 and 9. If the metallized layer 121 of the high melting point metal component and the low melting point metal component is formed on the Cu film (Cu foil) 125, the electrical resistance can be reduced by increasing the sectional area of the whole metallized trace 12 without varying the thickness of the Cu film 125. Alternatively, the electrical resistance can be reduced by increasing the sectional area of the whole metallized trace 12 such that while the thickness of the Cu film 125 is reduced, the metallized layer 121 of the high melting point metal component and the low melting point metal component to be adhered thereto is formed thick.

Figure 10:
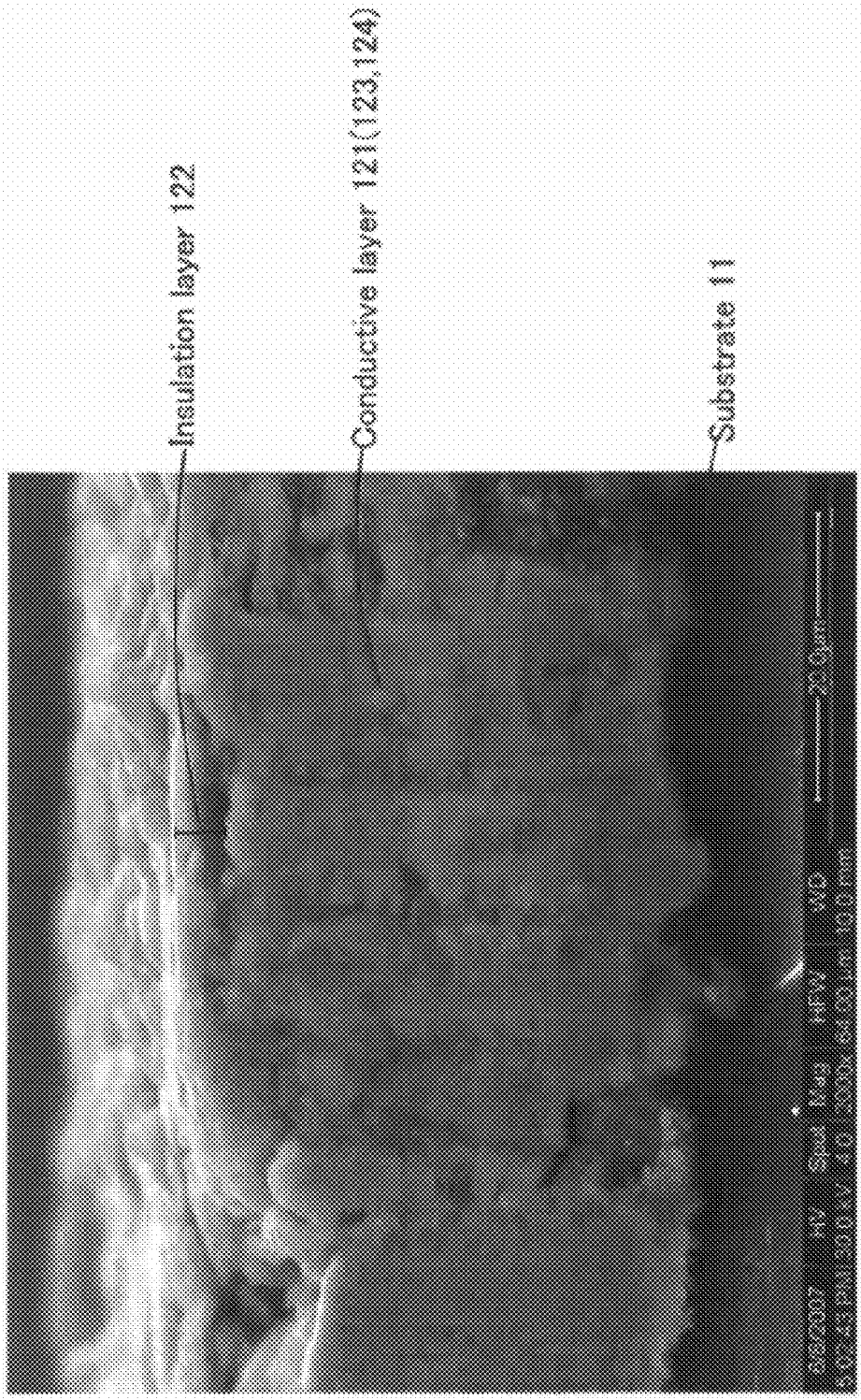
FIG. 10 is a photograph showing a section of a metallized trace of an electronic device according to the present invention.

FIG. 10 is a photograph showing a section of a metallized trace 12 according to the present invention. The metallized trace 12 comprises Sn, Bi and Ag and is divided in two layers: insulation layer 122 and metallized layer 121, and the surface of the metallized layer 121 is covered with the insulation layer 122. It is seen from FIG. 10 that the metallized layer 121 is free from a void or disconnection.

Figure 11:
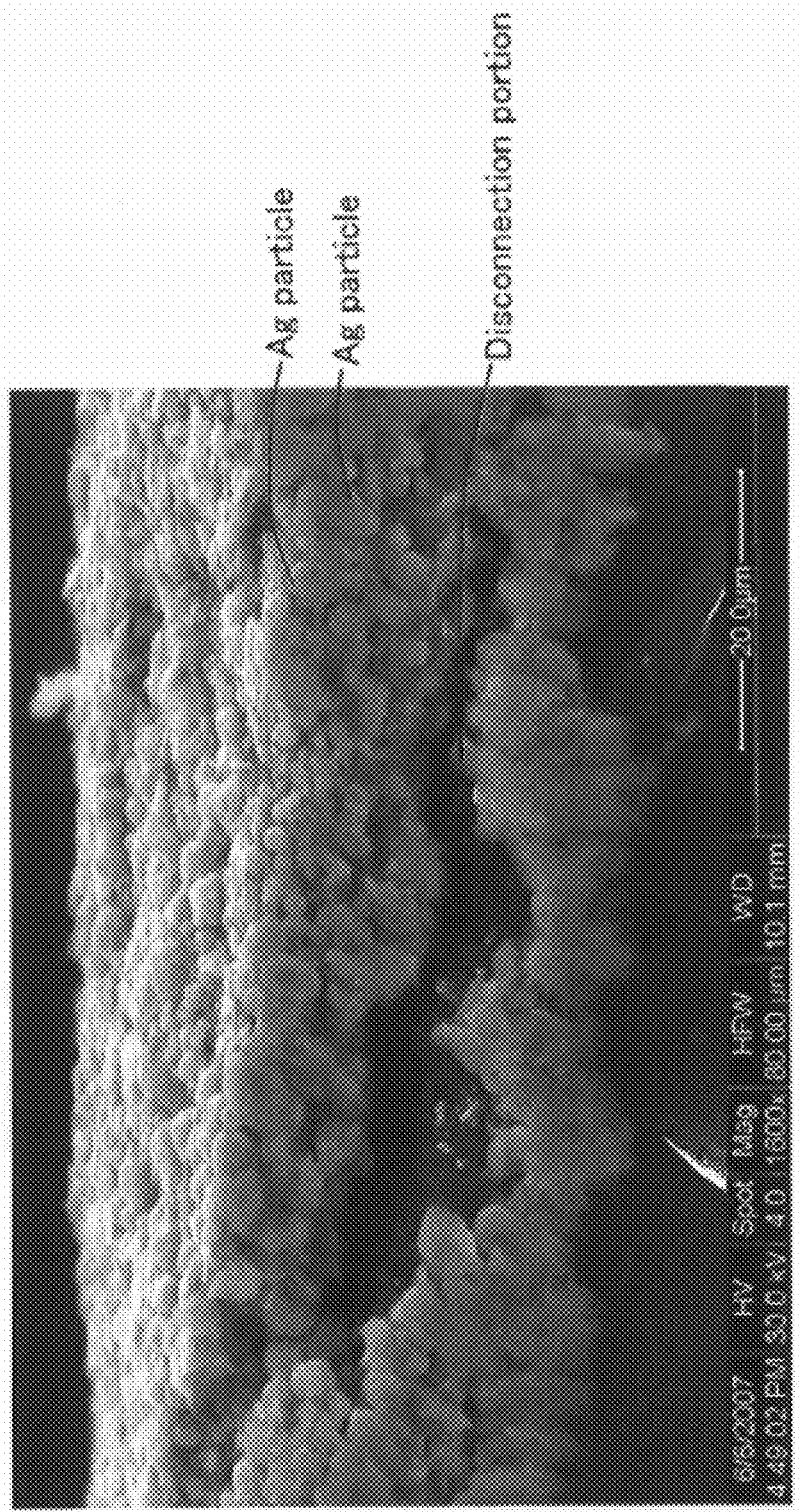
FIG. 11 is a photograph showing a section of a metallized trace of a comparative example.

FIG. 11 is a photograph showing a section of a trace of a comparative example obtained from a conductive paste comprising silver particles and an epoxy insulating resin. From this sectional photograph, it is seen that the silver particles are present individually without any coating. It also shows a disconnection portion.

As shown in FIG. 10, the metallized trace 12 according to the present invention is divided in two layers: insulation layer 122 and metallized layer 121, and the surface of the metallized layer 121 is covered with the insulation layer 122. In the comparative example, on the other hand, the silver particles are present individually without any coating, as shown in FIG. 11, and it appears that the silver migration has occurred. The dark portion that can be seen at the middle of FIG. 11 is the disconnection portion due to the silver migration.

Moreover, a strength test was conducted to find out the number of times of bending required to cause disconnection for a PET film having the metallized trace according to the present invention and a PET film having the silver trace according to the above comparative example. They were tested at the same conditions such as load to be applied, coating thickness, room temperature and so on.

While about 50 times of bending caused the disconnection in the PET film having the silver trace according to the comparative example, the PET film having the metallized trace according to the present invention required more than 5000 times of bending before the occurrence of the disconnection.

The electronic device according to the present invention can be any electrical product based on the technology of electronics. Typical examples include a computer, a mobile information equipment, a computer terminal, an office automation equipment, a communication equipment, a business information terminal, an automatic recognition system, a car electronics equipment, an industrial machine, a home entertainment equipment, an audio equipment, a video equipment and a home appliance. More specifically, they include, but not limited to, a liquid crystal display, a personal computer, an automotive navigation system, a mobile phone, a multilayer electronic equipment, a solar cell, a photovoltaic unit, a light-emitting diode, a light-emitting device, a lighting apparatus, a signal light, a video game console, a digital camera, a television set, a DVD player, an electronic organizer, an electronic dictionary, a hard disk recorder, a personal digital assistant (PDA), a video camera, a printer, a plasma display and a radio. Because of the limited space, a computer, a mobile phone, a multilayer electronic equipment, a solar cell, a photovoltaic unit, a light-emitting diode, a light-emitting device, a lighting apparatus, a signal light and a liquid crystal display will be described below as an example of the above electronic device.

(Personal Computer)

Figure 12:
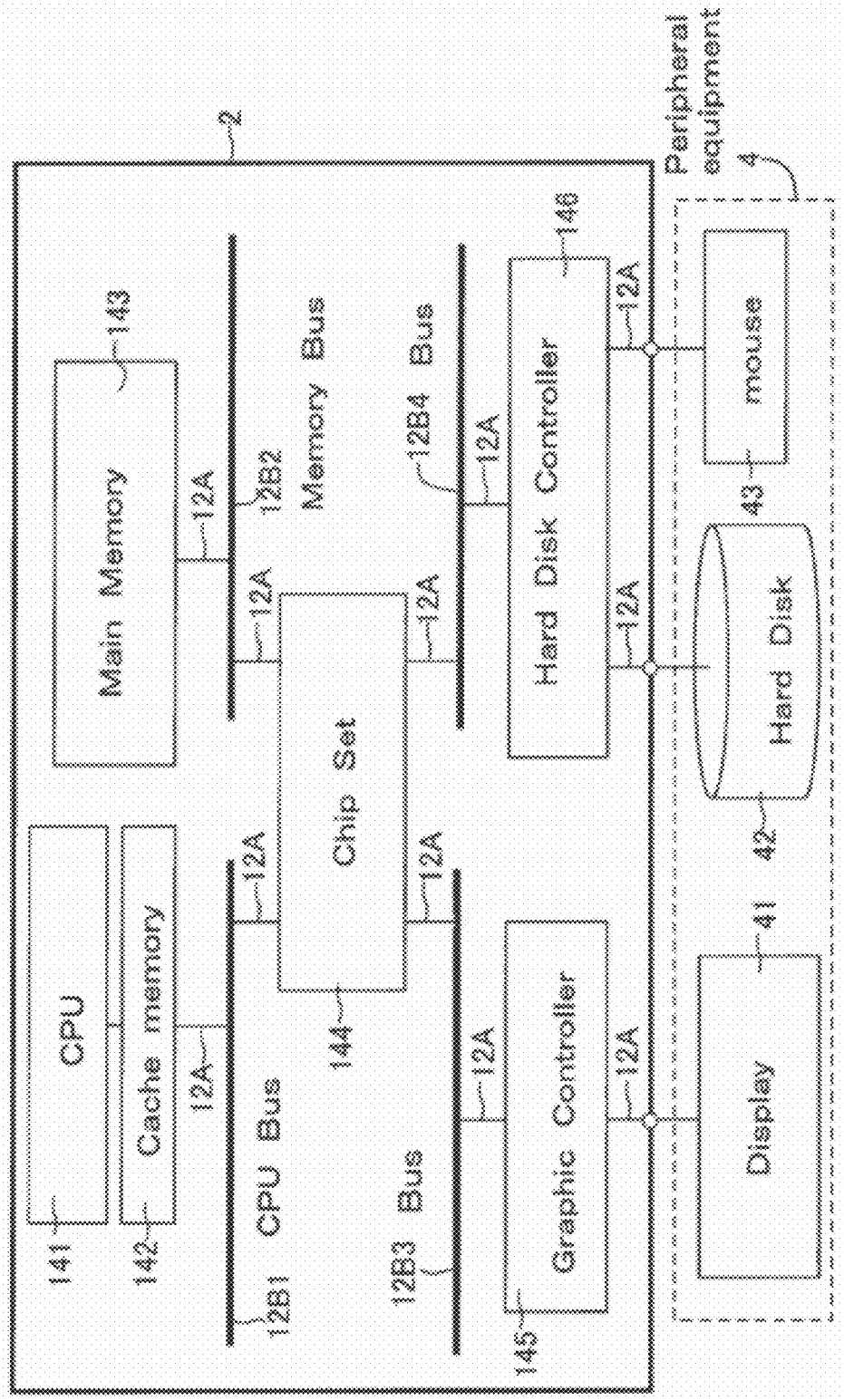
FIG. 12 is a drawing showing a configuration of a computer being one embodiment of an electronic device according to the present invention.

As shown in FIG. 12, for example, many types of personal computers have a basic structure based on a CPU (central processing unit) 141 and a main memory 143 such as a DRAM with additional components such as a hard disk controller 146, a graphic controller 145 and so on. The individual components are connected to each other via a CPU bus 12B1, a memory bus 12B2 and internal buses 12B3, 12B4 being a communication channel, while these buses 12B1 to 12B4 are connected to each other via a chip set 144. In many cases, the CPU 141 includes a part of the memory function (cache memory) 142, while the main memory 143 stores data and program information. Moreover, an input device 43 (keyboard, mouse, scanner, etc.), an output device 41 (liquid crystal display, speaker, etc.), a secondary storage device (hard disk drive, etc.) and a communication device (modem, network interface, etc.) are provided as a peripheral equipment 4.

The metallized trace according to the present invention can be applied not only to the CPU bus 12B1, the memory bus 12B2 and the internal buses 12B3, 12B4 but also to traces 12A between the individual components 141 to 146, 4 and the buses 12B1 to 12B4. That is, when forming the buses 12B1 to 12B4 and the traces 12A between the components 141 to 146, 4 and the buses 12B1 to 12B4 on a board (substrate), these traces can be formed as the metallized trace according to the present invention. The metallized trace has a metallized layer 121 and an insulation layer 122, as shown in FIGS. 2 to 4. The metallized layer 121 has a high melting point metal component and a low melting point metal component, the high melting point metal component and the low melting point metal component being diffusion bonded together to form a continuous layer. The insulation layer 122 is formed simultaneously with the metallized layer 121 to form a protective film covering the outer surface of the metallized layer 121. This is true for the traces 12A between the individual components and the buses 12B1 to 12B4.

Thus, the personal computer can be provided with high-quality, highly-reliable buses 12B1 to 12B4 and traces 12A which are excellent in conductivity, electrochemical stability, oxidation resistance, packability, density, and mechanical and physical strength and also have high adhesion strength and bond strength to a substrate.

(Mobile Phone)

Figure 13:
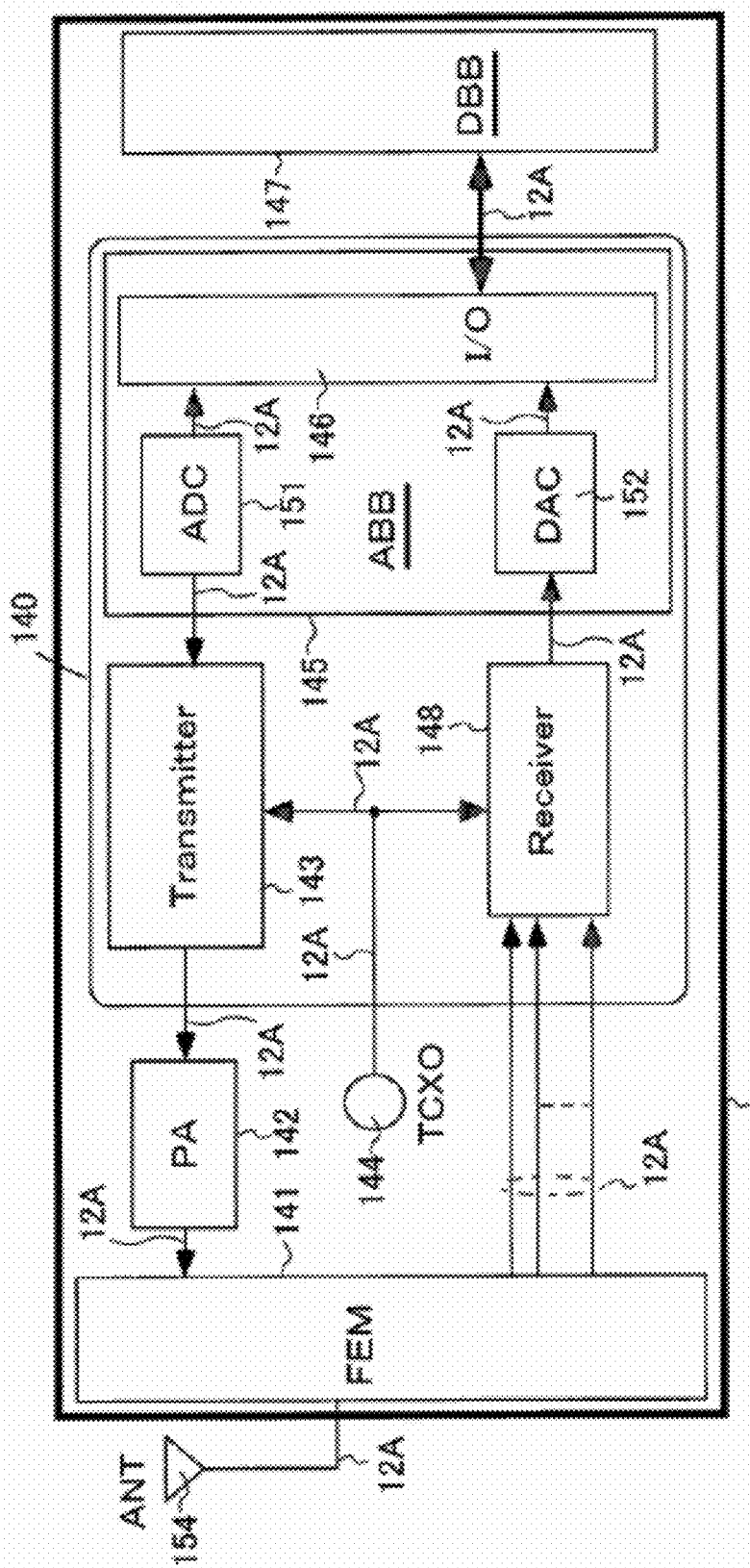
FIG. 13 is a drawing showing a configuration of a mobile phone being another embodiment of an electronic device according to the present invention.

Next, FIG. 13 shows a mobile phone which, for example, comprises an antenna 154, a front end module 141, a power amplifier circuit 142, a transceiver IC 140 and a digital baseband 147. The transceiver IC includes a transmitter circuit 143, a receiver circuit 148, an analog circuit 145 for processing the baseband and an input-output interface I/O 146. The analog circuit 145 has an AD converter circuit 151 and a DA converter circuit 152.

The metallized trace according to the present invention can be applied not only to traces 12A between the antenna 154, the front end module 141, the power amplifier circuit 142, the transceiver IC 140 and the digital baseband 147 but also to internal traces of the individual components 141 to 154.

Thus, the mobile phone can be provided with high-quality, highly-reliable traces 12A and internal traces which are excellent in conductivity, electrochemical stability, oxidation resistance, packability, density, and mechanical and physical strength and also have high adhesion strength and bond strength to a substrate.

(Multilayer Electronic Equipment)

Figure 14:
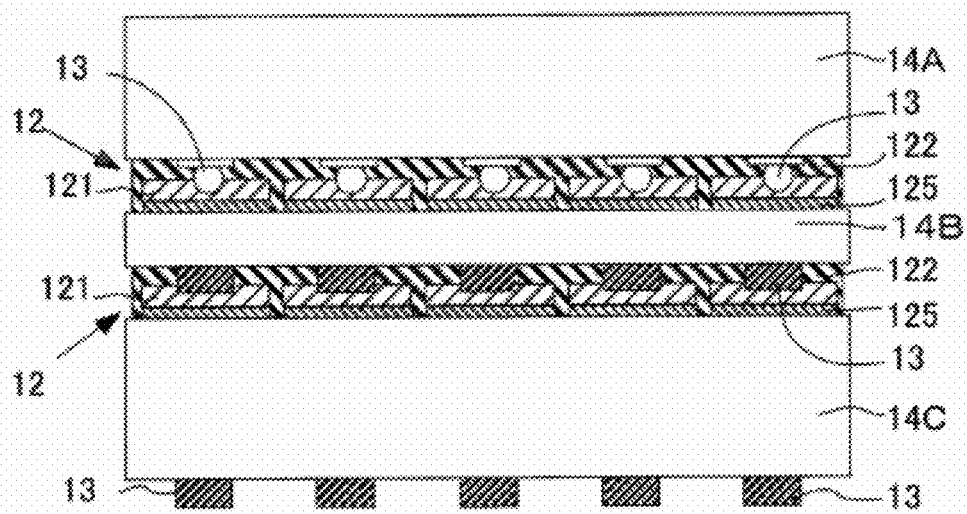
FIG. 14 is a drawing showing a multilayer electronic equipment being still another embodiment of an electronic device according to the present invention.

Next, FIG. 14 shows a multilayer electronic equipment in which a first chip part 14A, a second chip part 14B and a third chip part 14C are stacked. In the computer shown in FIG. 12, for example, the first chip part 14A and the third chip part 14C may be a chip of the main memory 143 and a logic IC chip to be connected thereto. The second chip part 14B may be an interposer to be disposed between the first chip part 14A for serving as the main memory chip and the third chip part 14C for serving as the logic IC chip and provide desired traces between them. Metallized traces 12 are formed in a predetermined pattern between the second chip part 14B and the third chip part 14C and between the second chip part 14B and the first chip part 14A.

The metallized traces 12 are according to the present invention and have a metallized layer 121 and an insulation layer 122. The metallized layer 121 has a high melting point metal component and a low melting point metal component, the high melting point metal component and the low melting point metal component being diffusion bonded together to form a continuous metallized layer 121. The insulation layer 122 comprises an insulating resin and is formed simultaneously with the metallized layer 121 to form a protective film covering the outer surface of the metallized layer 121.

Thus, the multilayer electronic equipment can be provided with high-quality, highly-reliable metallized traces 12 which are excellent in conductivity, electrochemical stability, oxidation resistance, packability, density, and mechanical and physical strength and also have high adhesion strength and bond strength between substrates.

Figure 15:
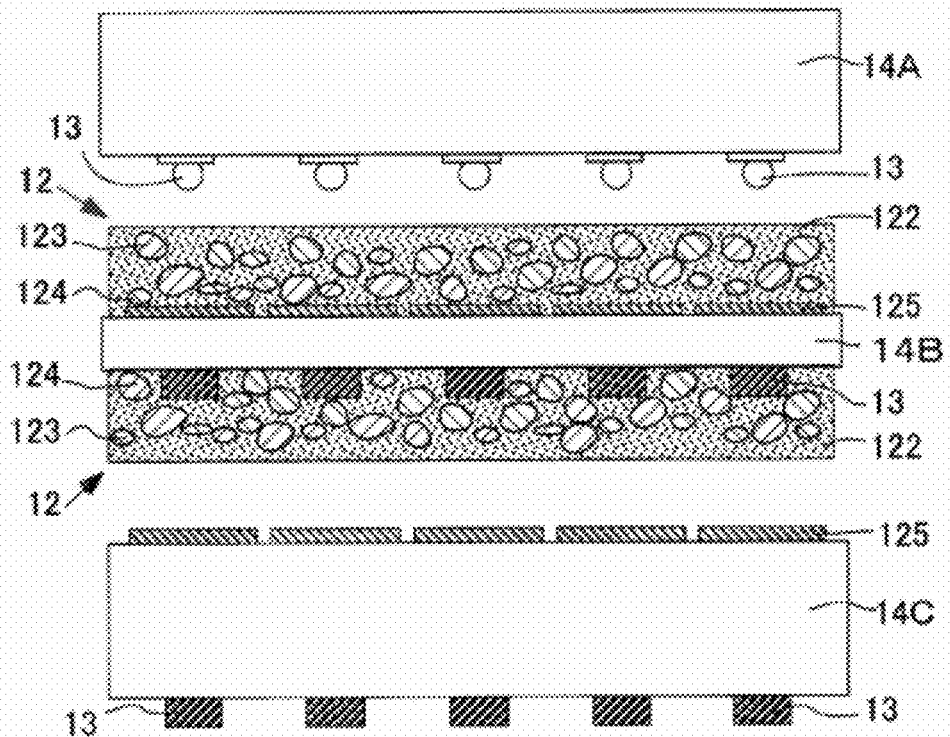
FIG. 15 is a drawing showing a process of producing the multilayer electronic equipment shown in FIG. 14.

The three-dimensional multilayer electronic equipment shown in FIG. 14 can be obtained such that a conductive paste 12 according to the present invention is applied to one or both sides of the second chip part 14B as shown in FIG. 15 and subjected to a heat treatment after the application. In the heat treatment, since the conductive paste 12 contains a high melting point metal component and a low melting point metal component, heating is performed at a temperature higher than the melting point of the low melting point metal component and lower than the melting point of the high melting point metal component, e.g., 100 to 300° C. This heat treatment melts the low melting point metal component. This allows the high melting point metal component and the low melting point metal component to aggregate into a packed structure where the space between adjacent parts of the high melting point metal component is filled with the molten low melting point metal component, while causing the diffusion bonding between the low melting point metal component and the high melting point metal component.

The low melting point metal component and the high melting point metal component aggregate toward terminal electrodes 13 of the first chip part 14A and terminal electrodes 125 of the second chip part 14B and toward terminal electrodes 13 of the second chip part 14B and terminal electrodes 125 of the third chip part 14C, thereby forming a metallized layer 121 for connecting the terminal electrodes 13 of the first chip part 14A to the terminal electrodes 125 of the second chip part 14B and a metallized layer 121 for connecting the terminal electrodes 13 of the second chip part 14B to the terminal electrodes 125 of the third chip part 14C. The outer surface (top face and side faces) of the metallized layer 121 is covered with the protective layer 122 of an insulating resin.

When the second chip part 14B is an interposer, it is desirable that through-electrodes are formed in a thickness direction using a so-called TSV (through-silicon-via) technology. This realizes a three-dimensional circuit structure, contributing to increasing the capacity and the transfer rate and improving the high-frequency characteristics with a different approach from reducing the line width.

A vertical conductor that plays a central role in realizing the TSV structure is preferably a melt-solidified conductor formed by a molten metal filling process. With the molten metal filling process, for example, the vertical conductor (through-electrode) being a melt-solidified body can be formed such that a molten metal is filled into a fine hole previously formed in a substrate and the filled molten metal is cooled and hardened while a pressure using a pressing plate, an injection pressure or a rolling pressure is applied thereto. With this molten metal filling process, high-quality vertical conductors (through-electrodes) free from voids or the like can be formed in an extremely short period of time as compared with plating and the like. Therefore, a high-quality electronic device having a three-dimensional structure for increasing the capacity and the transfer rate and improving the high-frequency characteristics can be realized with a different approach from reducing the line width.

According to another embodiment, the three-dimensional structure can be realized by applying the TSV technology to the electronic components 141 to 146 themselves such as a memory or a logic IC. Also in the mobile phone shown in FIG. 13, the TSV technology can be applied to the main components.

(Solar Cell)

Figure 16:
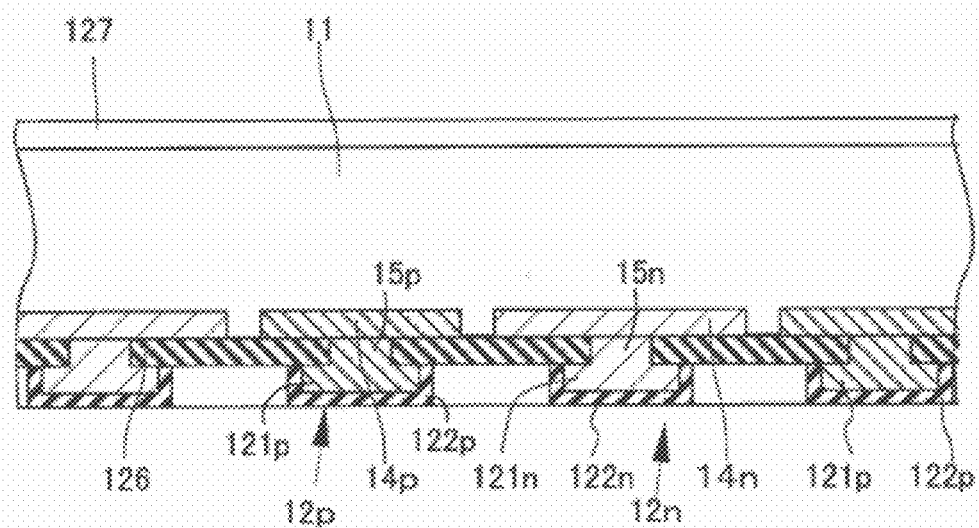
FIG. 16 is a sectional view of a solar cell being still another embodiment of an electronic device according to the present invention.
Figure 17:
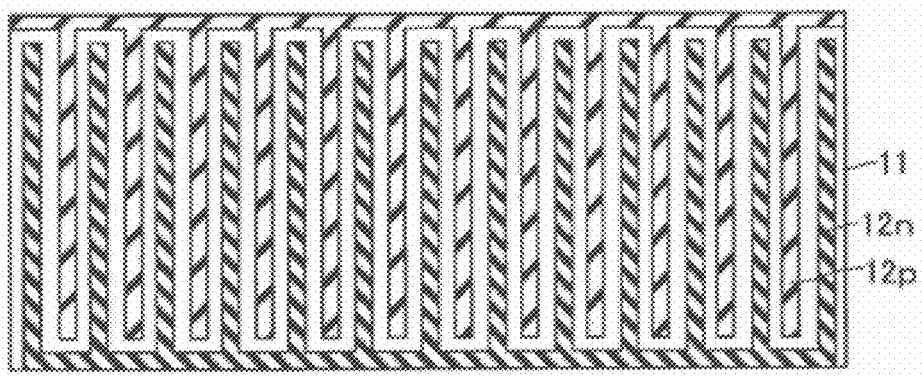
FIG. 17 is a bottom view of the solar cell shown in FIG. 16 (which is opposite from a light incident side)

For electrical connection to a p+semiconductor layer 14p and an n+semiconductor layer 14n on a back side of a silicon substrate 11 (which is opposite from a light incident side), as shown in FIGS. 16 and 17, after a passivation film 126 formed over the back side of the silicon substrate 11 is removed in a desired pattern, a p electrode contact 15p and an n electrode contact 15n are formed on the p+semiconductor layer 14p and the n+semiconductor layer 14n, respectively, at portions from which the passivation film 126 is removed. Moreover, an n metallized trace 12n is formed on the passivation film 126 and the n electrode contact 15n, while a p metallized trace 12p is formed on the passivation film 126 and the p electrode contact 15*p*. The p metallized trace 12*p* and the n metallized trace 12*n* are electrodes for mainly collecting a current generated in the solar cell and formed as an interdigital electrode. When a number of solar cells should be arranged on the single silicon substrate 11, either the p metallized trace 12*p* or the n metallized trace 12*n* can serve as a bus electrode for connecting the solar cells.

Here, the p metallized trace 12*p* has a metallized layer 121*p* and an insulation layer 122*p*. The metallized layer 121*p* has a high melting point metal component and a low melting point metal component. The high melting point metal component and the low melting point metal component are diffusion bonded together. The insulation layer 122*p* is formed simultaneously with the metallized layer 121*p* to form a protective film covering the outer surface of the metallized layer 121*p*.

Likewise, the n metallized trace 12*n* has a metallized layer 121*n* and an insulation layer 122*n*. The metallized layer 121*n* has a high melting point metal component and a low melting point metal component. The high melting point metal component and the low melting point metal component are diffusion bonded together to form the metallized layer 121*n*. The insulation layer 122*n* is formed simultaneously with the metallized layer 121*n* to form a protective film covering the outer surface of the metallized layer 121*n*. The formation process is the same as described above.

Figure 18:
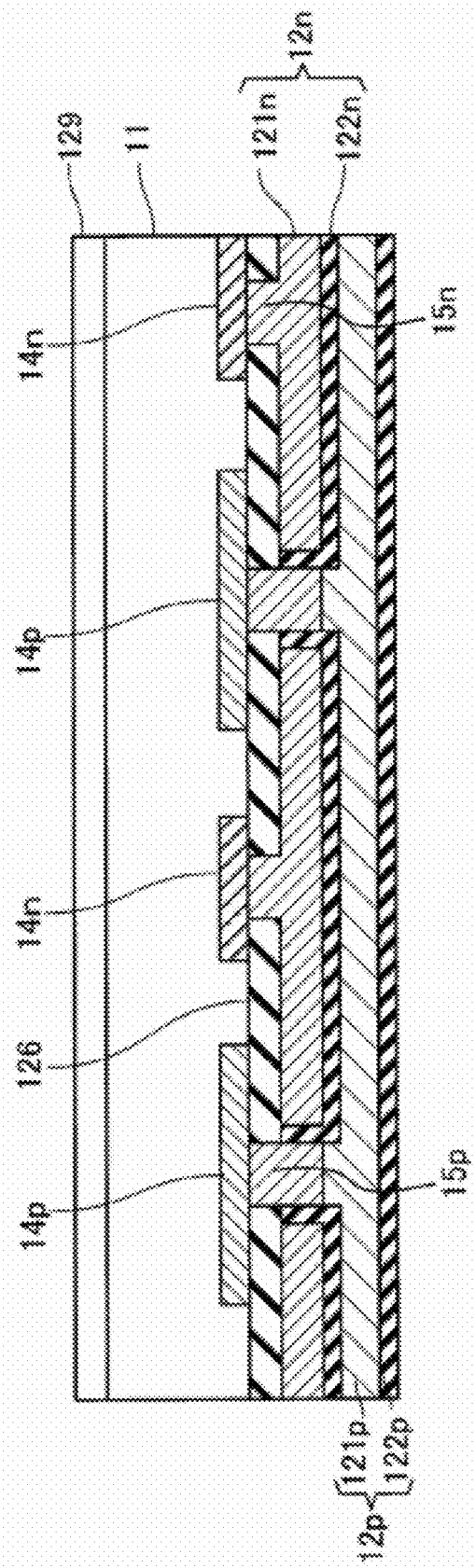
FIG. 18 is a sectional view showing another solar cell.

Referring to FIG. 18, on the other hand, the n electrode contact 15*n* to be electrically connected to the n+semiconductor layer 14*n* and the p electrode contact 15*p* to be electrically connected to the p+semiconductor layer 14*p* are formed on the passivation film 126 formed over one side of the silicon substrate 11. The n metallized trace 12*n* is formed on the n electrode contact 15*n* and the passivation film 126, while the p metallized trace 12*p* is formed in such a manner as to cover the surface of the n metallized trace 12*n* but expose the surface of the p electrode contact 15*p*.

The metallized layer 121*n* of the n metallized trace 12*n* has a high melting point metal component and a low melting point metal component, the high melting point metal component and the low melting point metal component being diffusion bonded together. The insulation layer 122*n* is formed simultaneously with the metallized layer 121*n* to cover the outer surface of the metallized layer 121*n*. The metallized layer 121*n* is connected to the n electrode contact 15*n*.

The metallized layer 121*p* of the p metallized trace 12*p* has a high melting point metal component and a low melting point metal component, the high melting point metal component and the low melting point metal component being diffusion bonded together. The insulation layer 122*p* is formed simultaneously with the metallized layer 121*p* to form a protective film covering the outer surface of the metallized layer 121*p*. The metallized layer 121*p* is connected to the p electrode contact 15*p*. An antireflection film 129 is adhered to the light incident surface of the substrate 11.

With the above structure, as understood from the foregoing description, the solar cell can be provided with metallized layers 121*p*, 121*n* which are excellent in conductivity, electrochemical stability, oxidation resistance, packability, density, and mechanical and physical strength and also have high adhesion strength and bond strength to a substrate. Moreover, the effect of the present invention is particularly useful in that even when solar cells are put in severe natural environments, e.g., desert, they can stably work for a long period of time against wide temperature changes.

The metallized trace according to the present invention can be applied not only to the illustrated solar cell but also to other types of solar cells. For example, it can be used for the case where a transparent electrode is formed in a solar cell having a transparent electrode such as ITO on its light incident side or for the case where an electrode is formed in a dye-sensitized solar cell.

(Photovoltaic Unit)

Figure 19:
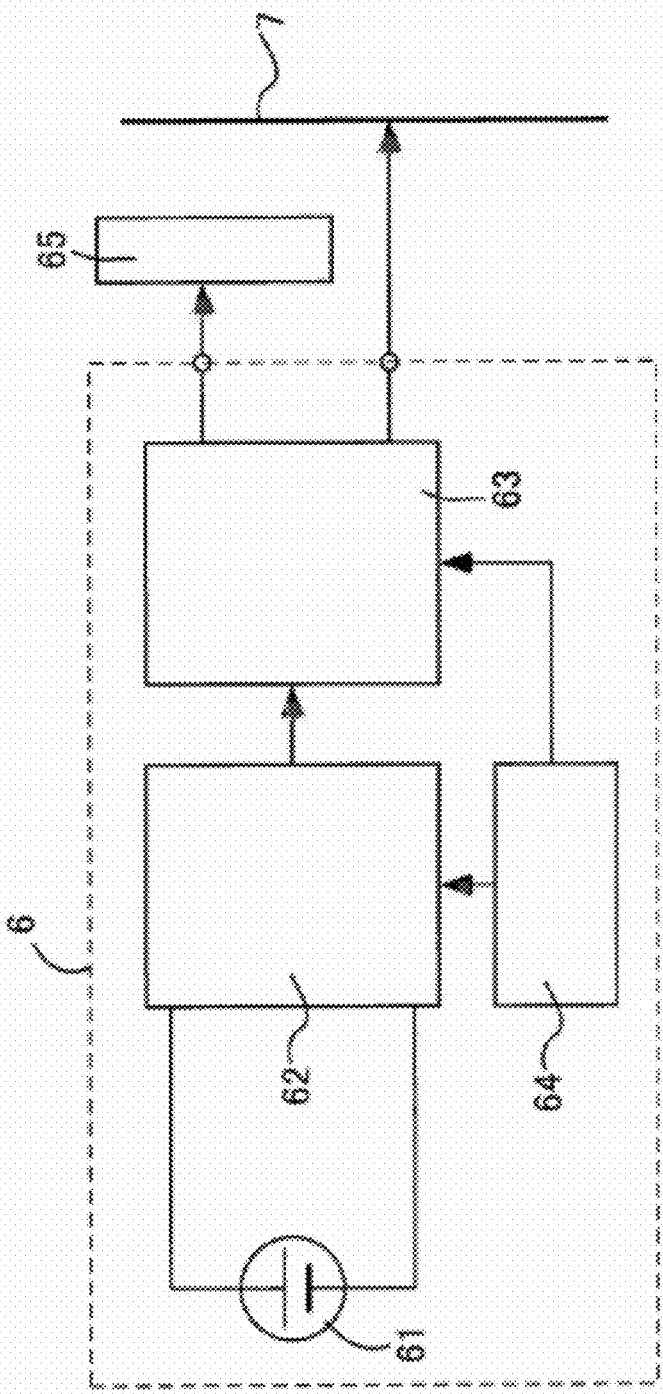
FIG. 19 is a block diagram of a photovoltaic unit shown in FIGS. 16 to 18.

FIG. 19 shows a photovoltaic unit 6 having a solar cell. The illustrated photovoltaic unit is designed to convert a direct current produced by a solar cell 61 into an alternating current through a power converter 62, supplying the converted alternating current to a load 65 and also selling surplus power to a commercial alternating-current system through a distributor 63. The power converter 62 and the distributor 63 are controlled by a controller 64. The solar cell 61 is an assembly of a large number of solar cells shown in FIGS. 16 to 18.

(Light-Emitting Diode)

Figure 20:
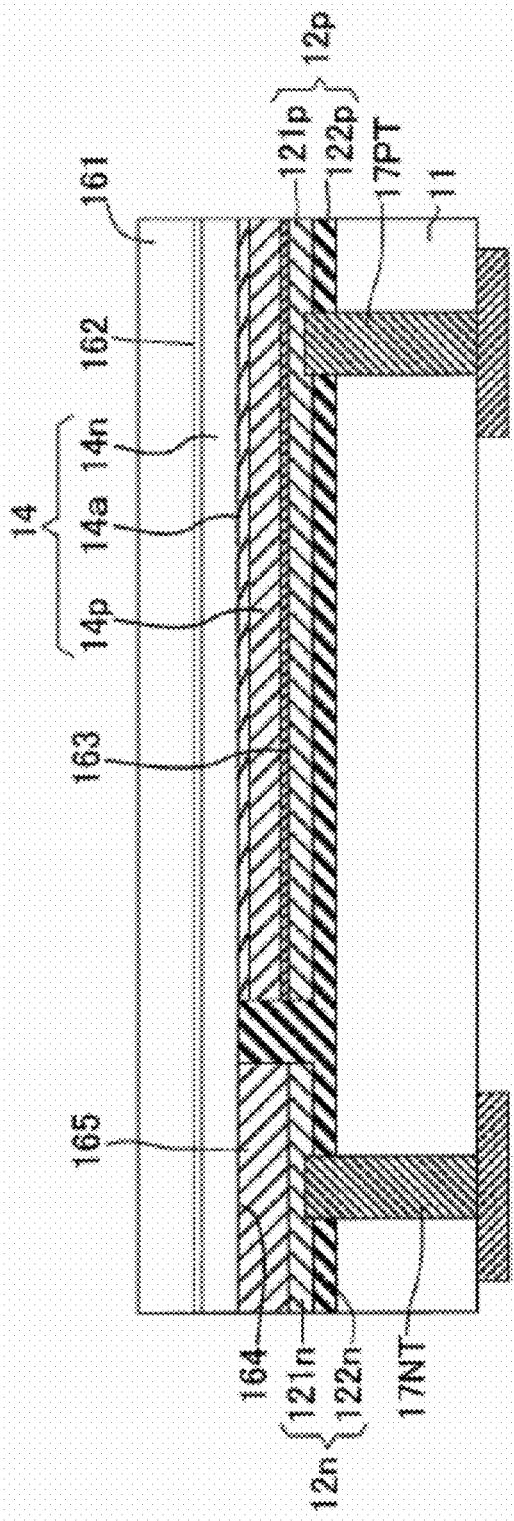
FIG. 20 is a sectional view of a light-emitting diode being still another embodiment of an electronic device according to the present invention.

Furthermore, FIG. 20 shows a light-emitting diode according to the present invention. The light-emitting diode shown in FIG. 20 comprises a light-emitting element 14, an n metallized trace (first metallized trace) 12*n*, and a p metallized trace (second metallized trace) 12*p*. The light-emitting element 14 is deposited on a transparent crystal substrate 161. The transparent crystal substrate 161 is made of sapphire or the like and has a light-emitting surface on its top side, while the light-emitting element 14 is deposited on the other side of the transparent crystal substrate 161 opposite from the light-emitting surface.

The light-emitting element 14 is formed such that an n-type semiconductor layer 14*n* is formed on a buffer layer 162 deposited on the transparent crystal substrate 161 and a p-type semiconductor layer 14*p* is deposited over the n-type semiconductor layer 14*n* with an active layer 14*a* therebetween. The n-type semiconductor layer 14*n* close to the transparent crystal substrate 161 has an area 164 which does not overlap with the p-type semiconductor layer 14*p*, and a recess at this area 164 is filled with a metal conductive layer 165.

The n metallized trace 12*n* is connected to the n-type semiconductor layer 14*n*, while the p metallized trace 12*p* is connected to the p-type semiconductor layer 14*p*. The n metallized trace 12*n* includes a metallized layer 121*n* and an insulation layer 122*n*, and the metallized layer 121*n* is joined to the surface of the metal conductive layer 165. The p metallized trace 12*p* has a metallized layer 121*p* that is disposed on the same side as the n metallized trace 12*n* and connected to the p-type semiconductor layer 14*p* through a reflection film 163.

First and second through electrodes 17NT, 17PT passing through a support substrate 11 and the insulation layer 122*n*, 122*p* are connected to the metallized layers 121*n*, 121*p*, respectively.

The n metallized trace 12*n* is formed at once using a common conductive paste including an insulating resin and a metal component. The metal component has a high melting point metal component and a low melting point metal component, the high melting point metal component and the low melting point metal component being diffusion bonded together into the metallized layer 121*n*. The insulation layer 122*n* comprises the insulating resin and covers the outer surface of the metallized layer 121*n*. The metallized layer 121*n* is connected to an n electrode contact 15*n*.

The p metallized trace 12*p* is also formed at once using a common conductive paste including an insulating resin and a metal component. The metal component has a high melting point metal component and a low melting point metal component, the high melting point metal component and the low melting point metal component being diffusion bonded together into the metallized layer 121*p*. The insulation layer 122p comprises the insulating resin and forms a protective film covering the outer surface of the metallized layer 121p.

With the above structure, it is apparent that the light-emitting diode can be provided with high-quality, highly-reliable metallized layers 121p, 121n which are excellent in conductivity, electrochemical stability, oxidation resistance, packability, density, and mechanical and physical strength and also have high adhesion strength and bond strength to a substrate.

The metallized trace according to the present invention can be applied not only to the illustrated light-emitting diode but also to other types of light-emitting diodes. For example, it can be used for the case where a transparent electrode is formed in a light-emitting diode having a transparent electrode such as ITO on its light-emitting side.

(Light-Emitting Device, Lighting Apparatus or Signal Light)

Figure 21:
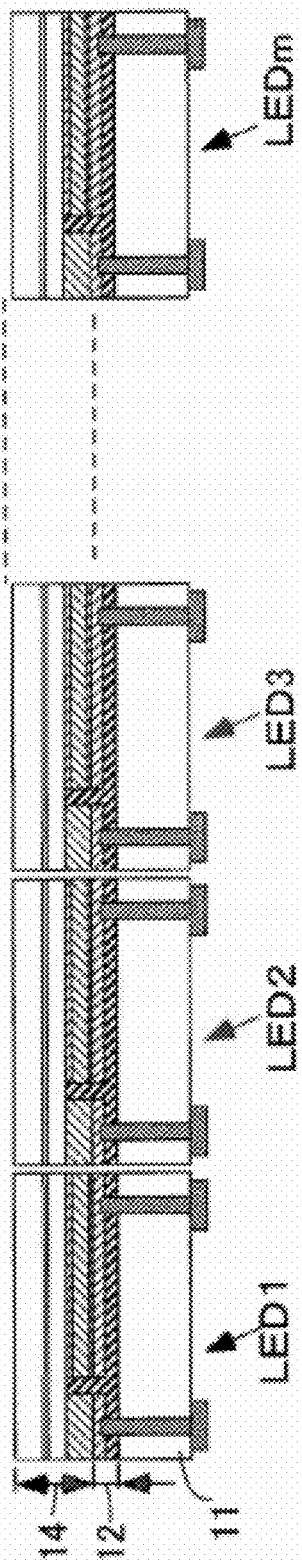
FIG. 21 is a drawing showing a light-emitting device, a lighting apparatus or a signal light using the light-emitting diode shown in FIG. 20.

FIG. 21 shows a light-emitting device having a plurality (m) of light-emitting diodes LED1 to LEDm. The light-emitting diodes LED1 to LEDm are identical to that shown in FIG. 20 and comprise the light-emitting element 14, the n metallized trace (first metallized trace) 12n, and the p metallized trace (second metallized trace) 12p. The concrete structure of the light-emitting diodes LED1 to LEDm is the same as described with reference to FIG. 20. The light-emitting diodes LED1 to LEDm may be arranged in a single row or in a plurality of rows. Moreover, a common substrate may be used for the light-emitting diodes LED1 to LEDm. Furthermore, the arranged light-emitting diodes may include R, G and B ones or may be monochromatic.

The light-emitting device shown in FIG. 21 can also be used as a lighting apparatus or a traffic light. As understood from the foregoing description, the light-emitting device, the lighting apparatus and the signal light have high quality and reliability.

(Liquid Crystal Display)

Figure 22:
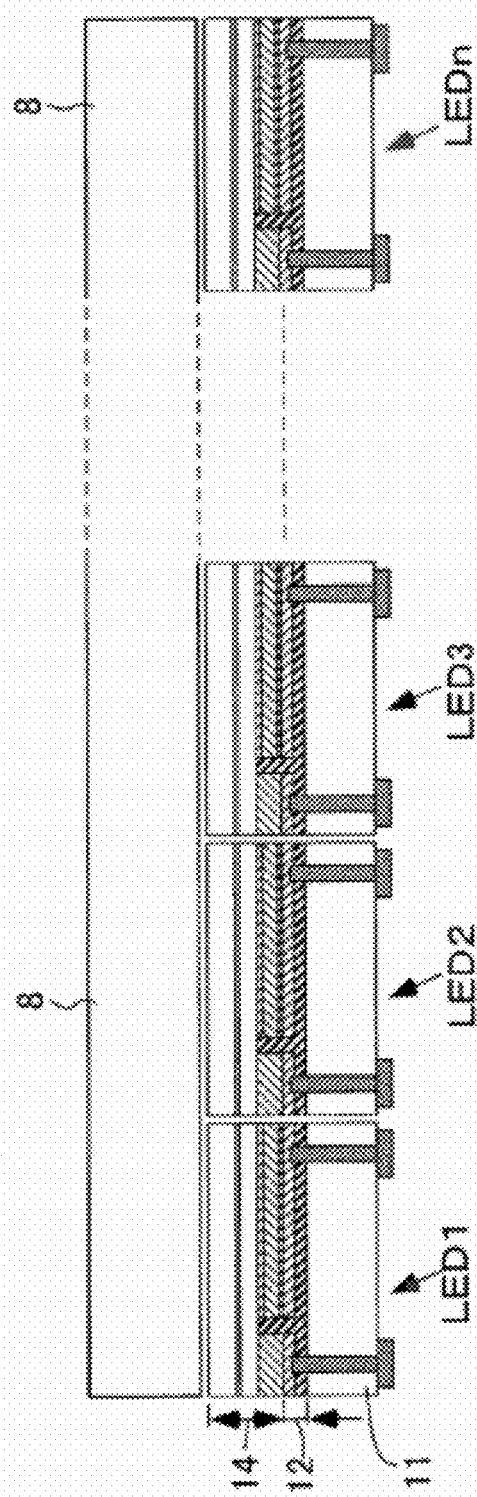
FIG. 22 is a partial sectional view of a liquid crystal display using the light-emitting diode shown in FIG. 20 as a backlight.

FIG. 22 is a drawing showing a liquid crystal display which is an assembly of a liquid crystal panel 8 and a backlight 9. The backlight 9 is formed such that a plurality (m) of light-emitting diodes LED1 to LEDm shown in FIG. 20 are arranged in the form of matrix. As understood from the foregoing description, the liquid crystal display has high quality and reliability.

While the present invention has been particularly shown and described with respect to preferred embodiments thereof, it will be understood by those skilled in the art that various changes in form and detail may be made therein without departing from the spirit, scope and teaching of the invention.

What is claimed is:

1. An electronic device comprising a substrate and an electronic component,
    the substrate having a metallized trace,
    the metallized trace having a metallized layer and an insulation layer,
    the metallized layer having a high melting point metal component and a low melting point metal component, the high melting point metal component and the low melting point metal component being diffusion bonded together,
    the insulation layer being formed simultaneously with the metallized layer to cover an outer surface of the metallized layer,
    the electronic component being electrically connected to the metallized layer.

2. The electronic device of claim 1, wherein the high melting point metal component includes at least one component selected from the group consisting of Ag, Cu, Au, Pt, Ti, Zn, Al, Fe, Si and Ni, while the low melting point metal component includes at least one component selected from the group consisting of Sn, In, Bi and Ga.

3. The electronic device of claim 1, wherein the metallized trace contains a carbon nanotube.

4. The electronic device of claim 1, wherein the metallized trace is formed on a metal film and the metallized layer is adhered onto the metal film.

5. The electronic device of claim 1 being a computer, a mobile information equipment, a computer terminal, an office automation equipment, a communication equipment, a business information terminal, an automatic recognition system, a car electronics equipment, an industrial machine, a home entertainment equipment, an audio equipment, a video equipment or a home appliance.

6. An electronic component comprising a plurality of stacked chip parts,
    the plurality of chip parts being bonded together through a metallized trace,
    the metallized trace having a metallized layer and an insulation layer,
    the metallized layer having a high melting point metal component and a low melting point metal component, the high melting point metal component and the low melting point metal component being diffusion bonded together,
    the insulation layer being formed simultaneously with the metallized layer to cover an outer surface of the metallized layer,
    the chip part being electrically connected to the metallized layer at a terminal electrode thereof.

7. The electronic component of claim 6, wherein the high melting point metal component includes at least one component selected from the group consisting of Ag, Cu, Au, Pt, Ti, Zn, Al, Fe, Si and Ni, while the low melting point metal component includes at least one component selected from the group consisting of Sn, In, Bi and Ga.

8. The electronic component of claim 6, wherein the metallized trace contains a carbon nanotube.

9. A solar cell comprising a semiconductor substrate, a first metallized trace and a second metallized trace,
    the semiconductor substrate having an n-type semiconductor layer and a p-type semiconductor layer,
    the first metallized trace being connected to the n-type semiconductor layer,
    the second metallized trace being connected to the p-type semiconductor layer,
    the first metallized trace and the second metallized trace each having a metallized layer and an insulation layer,
    the metallized layer having a high melting point metal component and a low melting point metal component, the high melting point metal component and the low melting point metal component being diffusion bonded together,
    the insulation layer being formed simultaneously with the metallized layer to cover an outer surface of the metallized layer.

10. The solar cell of claim 9, wherein the high melting point metal component includes at least one component selected from the group consisting of Ag, Cu, Au, Pt, Ti, Zn, Al, Fe, Si and Ni, while the low melting point metal component includes at least one component selected from the group consisting of Sn, In, Bi and Ga.

11. The solar cell of claim 9, wherein the metallized trace contains a carbon nanotube.

12. A photovoltaic unit comprising a solar cell,
    the solar cell including a semiconductor substrate, a first metallized trace and a second metallized trace, the semiconductor substrate having an n-type semiconductor layer and a p-type semiconductor layer, the first metallized trace being connected to the n-type semiconductor layer, the second metallized trace being connected to the p-type semiconductor layer, the first metallized trace and the second metallized trace each having a metallized layer and an insulation layer, the metallized layer having a high melting point metal component and a low melting point metal component, the high melting point metal component and the low melting point metal component being diffusion bonded together, the insulation layer being formed simultaneously with the metallized layer to cover an outer surface of the metallized layer.

13. The photovoltaic unit of claim 12, wherein the high melting point metal component includes at least one component selected from the group consisting of Ag, Cu, Au, Pt, Ti, Zn, Al, Fe, Si and Ni, while the low melting point metal component includes at least one component selected from the group consisting of Sn, In, Bi and Ga.

14. The photovoltaic unit of claim 12, wherein the metallized trace contains a carbon nanotube.

15. A light-emitting diode comprising a light-emitting element, a first metallized trace and a second metallized trace, the light-emitting element having a multilayer structure including an n-type semiconductor layer and a p-type semiconductor layer, the first metallized trace being connected to the n-type semiconductor layer, the second metallized trace being connected to the p-type semiconductor layer, the first metallized trace and the second metallized trace each having a metallized layer and an insulation layer, the metallized layer having a high melting point metal component and a low melting point metal component, the high melting point metal component and the low melting point metal component being diffusion bonded together, the insulation layer being formed simultaneously with the metallized layer to cover an outer surface of the metallized layer.

16. The light-emitting diode of claim 15, wherein the high melting point metal component includes at least one component selected from the group consisting of Ag, Cu, Au, Pt, Ti, Zn, Al, Fe, Si and Ni, while the low melting point metal component includes at least one component selected from the group consisting of Sn, In, Bi and Ga.

17. The light-emitting diode of claim 15, wherein the metallized trace contains a carbon nanotube.

18. A light-emitting device comprising a light-emitting diode, the light-emitting diode including a light-emitting element, a first metallized trace and a second metallized trace, the light-emitting element having a multilayer structure including an n-type semiconductor layer and a p-type semiconductor layer, the first metallized trace being connected to the n-type semiconductor layer, the second metallized trace being connected to the p-type semiconductor layer, the first metallized trace and the second metallized trace each having a metallized layer and an insulation layer, the metallized layer having a high melting point metal component and a low melting point metal component, the high melting point metal component and the low melting point metal component being diffusion bonded together, the insulation layer being formed simultaneously with the metallized layer to cover an outer surface of the metallized layer.

19. The light-emitting device of claim 18, wherein the high melting point metal component includes at least one component selected from the group consisting of Ag, Cu, Au, Pt, Ti, Zn, Al, Fe, Si and Ni, while the low melting point metal component includes at least one component selected from the group consisting of Sn, In, Bi and Ga.

20. The light-emitting device of claim 18, wherein the metallized trace contains a carbon nanotube.

21. A lighting apparatus comprising a light-emitting diode, the light-emitting diode including a light-emitting element, a first metallized trace and a second metallized trace, the light-emitting element having a multilayer structure including an n-type semiconductor layer and a p-type semiconductor layer, the first metallized trace being connected to the n-type semiconductor layer, the second metallized trace being connected to the p-type semiconductor layer, the first metallized trace and the second metallized trace each having a metallized layer and an insulation layer, the metallized layer having a high melting point metal component and a low melting point metal component, the high melting point metal component and the low melting point metal component being diffusion bonded together, the insulation layer being formed simultaneously with the metallized layer to cover an outer surface of the metallized layer.

22. The lighting apparatus of claim 21, wherein the high melting point metal component includes at least one component selected from the group consisting of Ag, Cu, Au, Pt, Ti, Zn, Al, Fe, Si and Ni, while the low melting point metal component includes at least one component selected from the group consisting of Sn, In, Bi and Ga.

23. The lighting apparatus of claim 21, wherein the metallized trace contains a carbon nanotube.

24. A signal light comprising a light-emitting diode, the light-emitting diode including a light-emitting element, a first metallized trace and a second metallized trace, the light-emitting element having a multilayer structure including an n-type semiconductor layer and a p-type semiconductor layer, the first metallized trace being connected to the n-type semiconductor layer, the second metallized trace being connected to the p-type semiconductor layer, the first metallized trace and the second metallized trace each having a metallized layer and an insulation layer, the metallized layer having a high melting point metal component and a low melting point metal component, the high melting point metal component and the low melting point metal component being diffusion bonded together, the insulation layer being formed simultaneously with the metallized layer to cover an outer surface of the metallized layer.

25. The signal light of claim 24, wherein the high melting point metal component includes at least one component selected from the group consisting of Ag, Cu, Au, Pt, Ti, Zn, Al, Fe, Si and Ni, while the low melting point metal component includes at least one component selected from the group consisting of Sn, In, Bi and Ga.

26. The signal light of claim 24, wherein the metallized trace contains a carbon nanotube.

27. A liquid crystal display comprising a liquid display panel and a backlight,
   the backlight being intended to illuminate the liquid crystal panel and including a plurality of arranged light-emitting diodes,
   the light-emitting diode having a light-emitting element, a first metallized trace and a second metallized trace,
   the light-emitting element having a multilayer structure including an n-type semiconductor layer and a p-type semiconductor layer,
   the first metallized trace being connected to the n-type semiconductor layer,
   the second metallized trace being connected to the p-type semiconductor layer,
   the first metallized trace and the second metallized trace each having a metallized layer and an insulation layer,
   the metallized layer having a high melting point metal component and a low melting point metal component, the high melting point metal component and the low melting point metal component being diffusion bonded together,
   the insulation layer being formed simultaneously with the metallized layer to cover an outer surface of the metallized layer.

28. The liquid crystal display of claim 27, wherein the high melting point metal component includes at least one component selected from the group consisting of Ag, Cu, Au, Pt, Ti, Zn, Al, Fe, Si and Ni, while the low melting point metal component includes at least one component selected from the group consisting of Sn, In, Bi and Ga.

29. The liquid crystal display of claim 27, wherein the metallized trace contains a carbon nanotube.

* * * * *